(12) United States Patent
Newman

(10) Patent No.: US 9,984,914 B2
(45) Date of Patent: May 29, 2018

(54) CARRIER TAPE

(71) Applicant: QUALCOMM Incorporated, San Diego, CA (US)

(72) Inventor: Anthony Thomas Newman, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/255,116

(22) Filed: Sep. 1, 2016

(65) Prior Publication Data
US 2017/0062262 A1    Mar. 2, 2017

Related U.S. Application Data

(60) Provisional application No. 62/213,491, filed on Sep. 2, 2015.

(51) Int. Cl.
*H01L 21/683* (2006.01)
*H01L 21/677* (2006.01)
*B65B 51/10* (2006.01)
*B65B 47/00* (2006.01)
*B65D 73/02* (2006.01)
(Continued)

(52) U.S. Cl.
CPC .......... *H01L 21/6836* (2013.01); *B65B 15/04* (2013.01); *B65B 47/00* (2013.01); *B65B 51/10* (2013.01); *B65D 73/02* (2013.01); *H01L 21/67706* (2013.01); *H05K 13/0084* (2013.01); *H01L 2221/68309* (2013.01); *H01L 2221/68313* (2013.01); *H01L 2221/68381* (2013.01)

(58) Field of Classification Search
CPC .......... H01L 21/6836; H01L 21/67706; H01L 2221/68309; H01L 2221/68381; H05K 13/0084; B65B 15/04; B65B 47/00; B65B 51/10; B65D 73/02
USPC ................................ 206/713, 714, 716, 717
See application file for complete search history.

(56) References Cited

U.S. PATENT DOCUMENTS 4,781,953 A * 11/1988 Ball ...................... B65D 73/02
                                                      206/714
5,234,104 A     8/1993 Schulte et al.
(Continued)

FOREIGN PATENT DOCUMENTS

EP          0957042 A1    11/1999

OTHER PUBLICATIONS

International Search Report and Written Opinion—PCT/US2016/050154—ISA/EPO—dated Dec. 2, 2016.

*Primary Examiner* — Chun Cheung
(74) *Attorney, Agent, or Firm* — Muncy, Geissler, Olds & Lowe, P.C./QUALCOMM

(57) ABSTRACT

A carrier tape (300) with a continuous channel (310) is proposed instead of the individual separate embossed pockets (110) prevalent in conventional carrier tapes (100). The continuous channel (310) reduces or even eliminates small bridge problem typically associated with the conventional carrier tapes (100). The proposed carrier tape (300) can include dividers (330) and cutouts (340) to accommodate the devices (205) with minimum pitch without sacrificing corner relief. A cover tape (450) can be included to seal the devices (205) below the top surface of the devices (205). Further, the floor (316) of the continuous channel (310) can be lined with an adhesive (560).

30 Claims, 7 Drawing Sheets

(51) Int. Cl.
*B65B 15/04* (2006.01)
*H05K 13/00* (2006.01)

(56) References Cited

U.S. PATENT DOCUMENTS

| | | | | |
|---|---|---|---|---|
| 5,361,901 A | * | 11/1994 | Schenz | H05K 13/021 |
| | | | | 206/714 |
| 5,499,717 A | * | 3/1996 | Hayashi | B65D 73/02 |
| | | | | 206/390 |
| 5,765,692 A | | 6/1998 | Schenz | |
| 5,931,337 A | * | 8/1999 | Ando | H05K 13/0084 |
| | | | | 221/1 |
| 6,398,034 B1 | | 6/2002 | Takiar et al. | |
| 6,467,627 B1 | * | 10/2002 | Troxtell, Jr. | B65D 73/02 |
| | | | | 206/713 |
| 7,044,304 B2 | * | 5/2006 | Tellkamp | H05K 13/0084 |
| | | | | 206/524.4 |
| 2004/0124119 A1 | | 7/2004 | Ahn et al. | |
| 2007/0074996 A1 | | 4/2007 | Nice et al. | |
| 2009/0262453 A1 | | 10/2009 | Romm | |
| 2015/0158649 A1 | | 6/2015 | Huang et al. | |

* cited by examiner

CARRIER TAPE

PRIOR APPLICATION

This Application claims priority to provisional application 62/213,491 filed on Sep. 2, 2015 and entitled "CARRIER TAPE", the entirety of which is incorporated by reference herein.

FIELD OF DISCLOSURE

One or more aspects of the present disclosure generally relate to carrier tapes, and in particular, to carrier tapes with continuous channels.

BACKGROUND

Carrier tapes are used to transport finished devices such as semiconductor dies. FIG. 1A illustrates a top view of a conventional carrier tape 100. The conventional carrier tape 100 has individual separate embossed pockets 110 to accommodate individual dies. The carrier tape 100 has fixed pitches 120 based on industry standards (e.g., 4 mm, 8 mm, 12 mm, etc.). When selecting a carrier tape for a product, it is best to minimize the pitch 120 to minimize the total length of the carrier tape 100 needed to ship the product.

The minimization of the pitch 120 is limited by a minimum space between the carrier tape pockets 110. This minimum space, referred to as a bridge, is labeled with element number 130 in FIG. 1A. Tape manufacturing processes require a minimum bridge 130 between the pockets 110 (typically >1.25 mm). As the pocket size is increased to accommodate larger devices, the space between the devices is decreased. If the pocket size for a given pitch is too large, then the only option is to increase the pitch 120 to the next higher increment, e.g., from 4 mm pitch to 8 mm pitch, as illustrated in FIG. 1B. For devices, increasing the pitch 120 increases the required amount of tape for a given quantity of the product, which in turn increases costs.

The conventional carrier tape 100 may include corner relief features 140 in the pockets 110 (see FIG. 1A), which are also referred to as "mouse ears". Note that the mouse ears 140 are small. These small features are difficult, if not impossible, to tool and form. Moreover, the bridge 130—the gap between successive pockets 110—is reduced by the mouse ears 140. Thus, conventional corner relief measures such as the mouse ears 140 exacerbate the pitch issue described above.

Another issue of the conventional carrier tape 100 is as follows. As mentioned, the conventional carrier tape 100 has fully isolated, individual pockets 110. But as semiconductor devices become thinner and more fragile, it becomes a challenge to: (1) keep the thin devices from escaping the carrier tape pocket; and (2) prevent chip outs on the active surface of the device from impacts with the carrier tape pocket wall during vibration or drop shock events.

FIG. 2A illustrates a top view and FIG. 2B illustrates a cross sectional view of a conventional way to address issue (1). FIG. 2A illustrates the conventional carrier tape 100 of FIG. 1A rotated 90 degrees. So as to minimize clutter, not all element numberings from FIG. 1A are repeated. In FIG. 2A, it is assumed that a device 205 has been placed in each discrete pocket 110. Also, a clear cover tape 250 is placed over the top of the pocket 110 and runs parallel to the length of the conventional carrier tape 100 to seal the devices 205 within the pockets 110.

FIG. 2B is a cross-sectional view of the conventional carrier tape 100 taken along the dashed line of FIG. 2A. The width of the conventional carrier tape 100 is expanded in FIG. 2B so as to better illustrate the sealing provided by the conventional cover tape 250. As seen, the device 205 is placed within the embossed pocket 110. The conventional cover tape 250 is placed over the top of the pocket 110 and is heat sealed or adhered to the top surface of the conventional carrier tape 100. Note that the conventional cover tape 250 is above the top surface of the device 205.

Unfortunately, the conventional cover tape 250 can "puff up" to create a gap or a small open space 255 between the top surface of the conventional carrier tape 100 and the bottom surface of the conventional cover tape 250. This puff up condition is illustrated in FIG. 2C. Historically this gap 255 has not been an issue. However, as devices become thinner, the thin devices can fit in this space 255 and migrate out of the pocket. In other words, the conventional way of utilizing the conventional cover tape 250 does not fully address issue (1) of keeping the devices 205 within the pockets 110 of the conventional carrier tape 100.

The conventional way of utilizing the cover tape 250 also does not address issue (2). There is necessarily some X/Y gap between the edges of the device and the walls of the pocket 110. In FIG. 2D, it is illustrated that as the device 205 sits inside this embossed pocket 110, the device 205 is free to impact the pocket side walls during vibration and shock events such as drops. As fabrication technologies have advanced, the active surfaces of devices 205 have become more fragile, and the impacts with the pocket walls, e.g., during handling and transportation, can damage the devices 205. The devices 205 can be particularly sensitive to axial impacts on the conventional carrier tape reel because the impact shock is transmitted to the device 205 with minimal dissipation.

A further issue is the following. IC packages have historically followed very standardized outlines—typically square. This has made the task of standardizing package carriers possible. For example, as seen in FIGS. 1A and 1B, the spacings between the pockets 110 are regular. But recently, there has been a trend in customizing package sizes as well as a tremendous increase in wafer level packages (WLP). This has driven a huge increase in customized package carriers since the carrier pockets must be customized to fit the specific "non-standard" IC device package. Exacerbating this is the need to minimize any excess space between fragile WLP devices and the carrier pocket wall to minimize the potential for damage during transportation and handling. This situation has driven the need for customized tooling for package carriers. Unfortunately, this has also led to increases in development lead times and reduction in economies of scale, thereby keeping package carrier costs high.

SUMMARY

This summary identifies features of some example aspects, and is not an exclusive or exhaustive description of the disclosed subject matter. Whether features or aspects are included in, or omitted from this Summary is not intended as indicative of relative importance of such features. Additional features and aspects are described, and will become apparent to persons skilled in the art upon reading the following detailed description and viewing the drawings that form a part thereof.

An exemplary carrier tape is disclosed. The carrier tape may comprise a continuous channel formed along a length of the carrier tape. The continuous channel may have first and second side walls and a floor. The carrier tape may also comprise a plurality of dividers formed in the continuous channel. The plurality of dividers may extend from the floor of the continuous channel. The spaces between each pair of adjacent dividers may correspond to device areas into which devices are placed.

Another exemplary carrier tape is disclosed. The carrier tape may comprise a continuous channel formed along a length of the carrier tape. The continuous channel may have first and second side walls and a floor. The carrier tape may also comprise a cover tape configured to hold devices within the continuous channel. The cover tape may cover top surfaces of the devices. The cover tape may also be sealed to the floor of the continuous channel on both sides of the devices.

An exemplary method of forming a carrier tape is disclosed. The method may comprise forming a continuous channel along a length of a carrier tape. The continuous channel may be formed to have first and second side walls and a floor. The method may also comprise forming a plurality of dividers in the continuous channel. The plurality of dividers may be formed to extend from the floor of the continuous channel. The plurality of dividers may also be formed such that spaces between each pair of adjacent dividers correspond to device areas into which devices are placed.

Another exemplary method of forming a carrier tape is disclosed. The method may comprise forming a continuous channel along a length of a carrier tape. The continuous channel may be formed to have first and second side walls and a floor. The method may also comprise placing a cover tape such that the devices are held within the continuous channel. Placing the cover tape may comprise covering top surfaces of the devices with the cover tape. Placing the cover tape may also comprise sealing the cover tape to the floor of the continuous channel on both sides of the devices.

A further exemplary carrier tape is disclosed. The carrier tape may comprise a continuous channel formed along a length of the carrier tape. The continuous channel may have first and second side walls and a floor. The carrier tape may also comprise a plurality of means for dividing the continuous channel. The plurality of means for dividing may extend from the floor of the continuous channel. The spaces between each pair of adjacent means for dividing may correspond to device areas into which devices are placed.

A yet further exemplary carrier tape is disclosed. The carrier tape may comprise a continuous channel formed along a length of the carrier tape. The continuous channel may have first and second side walls and a floor. The carrier tape may also comprise means for covering within the continuous channel. The means for covering may cover top surfaces of the devices. The means for covering may also be sealed to the floor of the continuous channel on both sides of the devices.

BRIEF DESCRIPTION OF THE DRAWINGS

The accompanying drawings are presented to aid in the description of embodiments of the present disclosure and are provided solely for illustration of the embodiments and not limitation thereof.

DETAILED DESCRIPTION

Aspects of the present disclosure are disclosed in the following description and related drawings directed to specific embodiments of the present disclosure. Alternate embodiments may be devised without departing from the scope of the present disclosure. Additionally, well-known elements will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments of the present disclosure include the discussed feature, advantage or mode of operation.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the present disclosure may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1A:
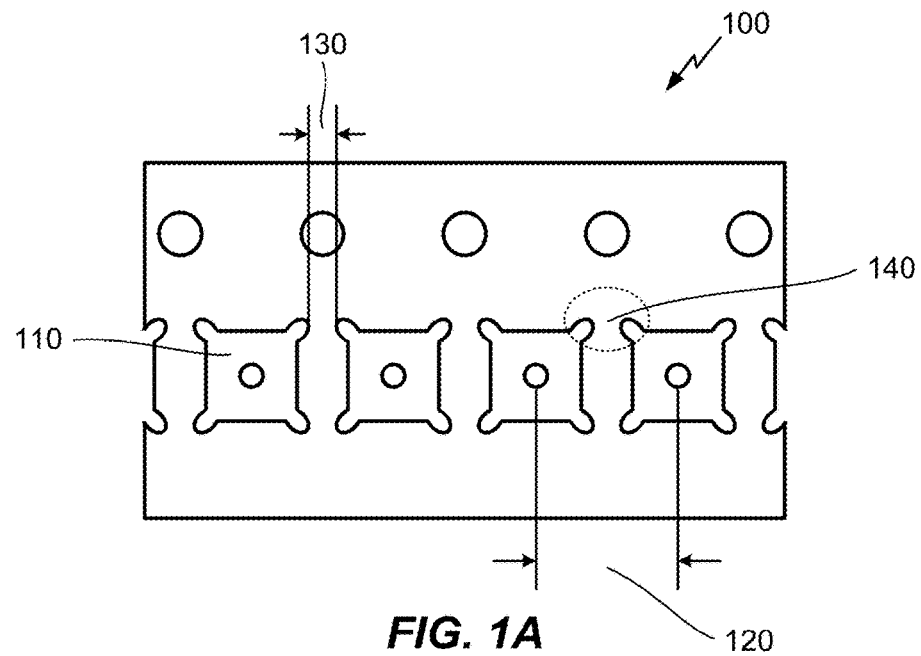
FIG. 1A illustrates a top view of a conventional carrier tape.
Figure 1B:
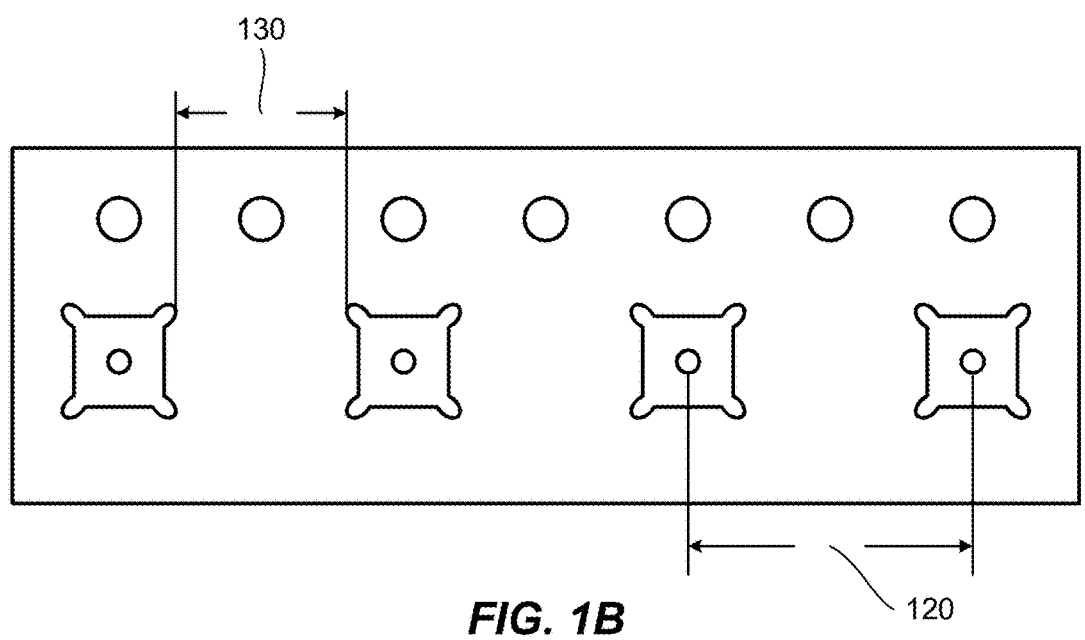
FIG. 1B illustrates a top view of a conventional tape with increased pitch width.
Figure 2A:
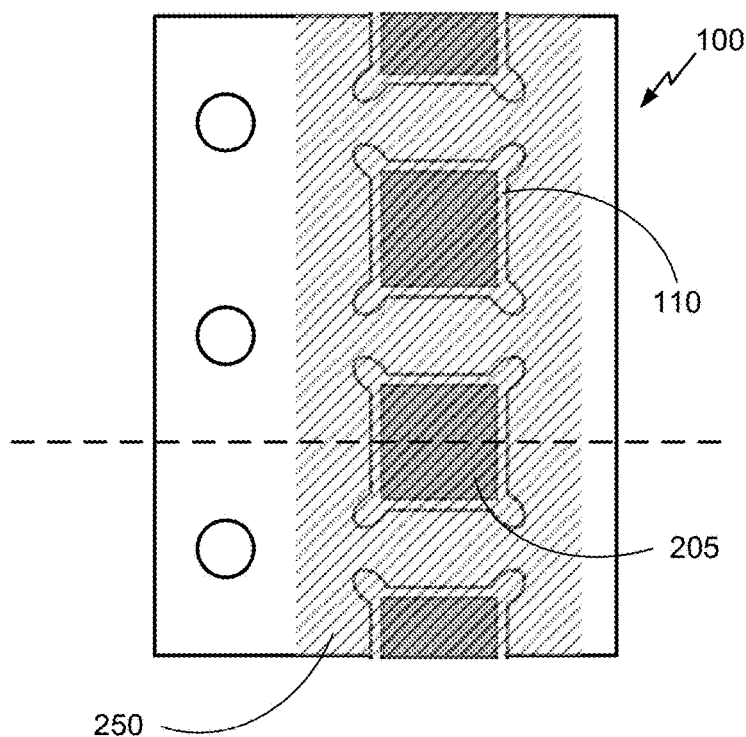
FIG. 2A illustrates a top view of a conventional carrier tape with a cover tape.
Figure 2B:
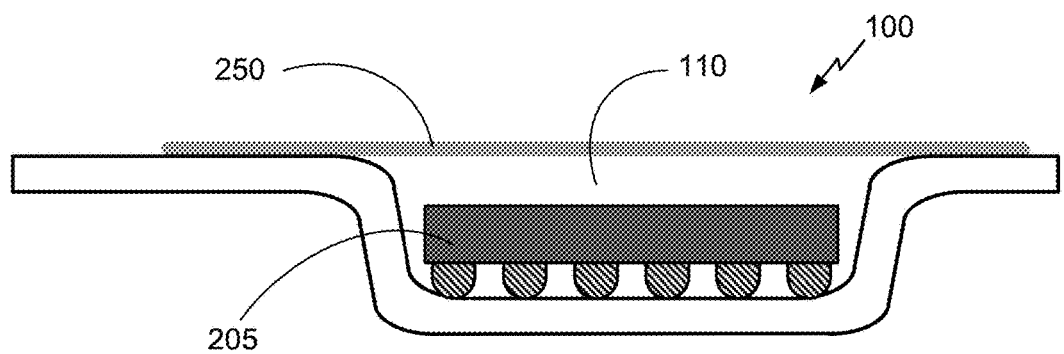
FIG. 2B illustrates a cross sectional view of a conventional carrier tape with a cover tape.
Figure 2C:
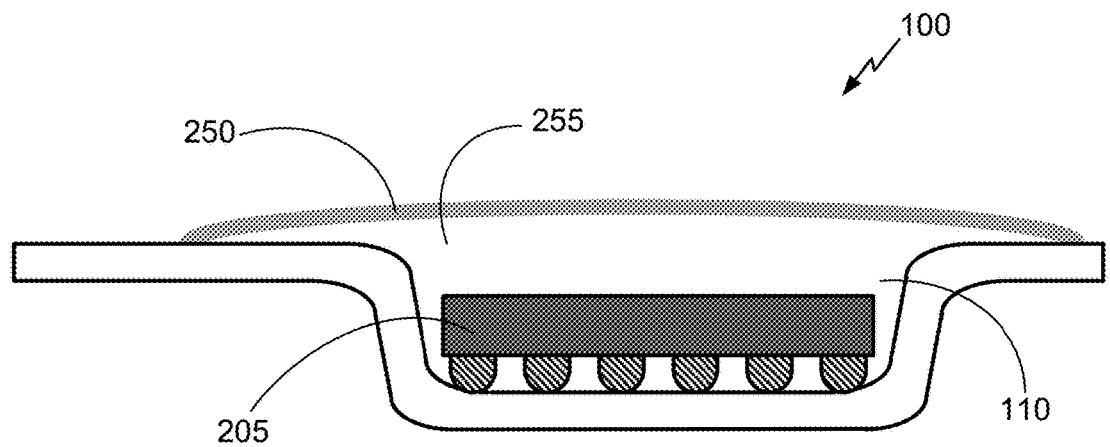
FIG. 2C illustrates a condition associated with a conventional cover tape in which a gap is created between the carrier tape and a cover tape.
Figure 2D:
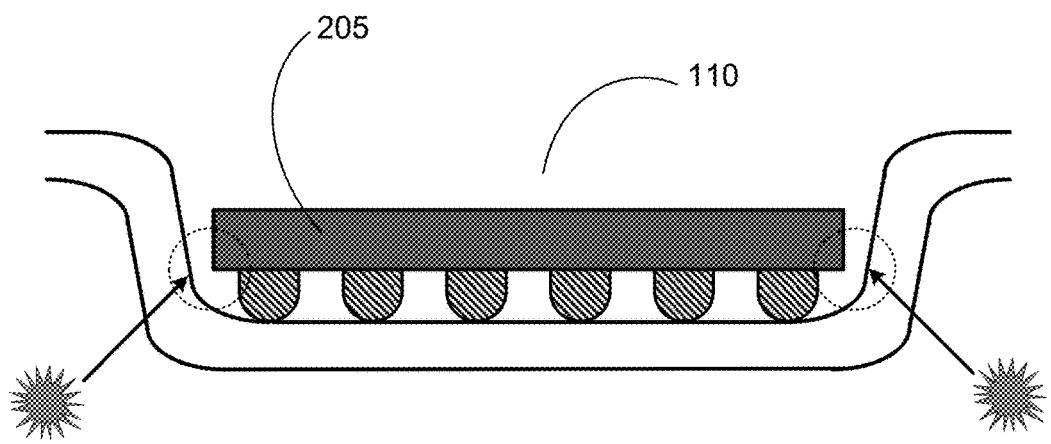
FIG. 2D illustrates a condition associated with a conventional cover tape in which a device in a pocket of the carrier tape suffers damage due to impacts with the walls of the pocket.
Figure 3A:
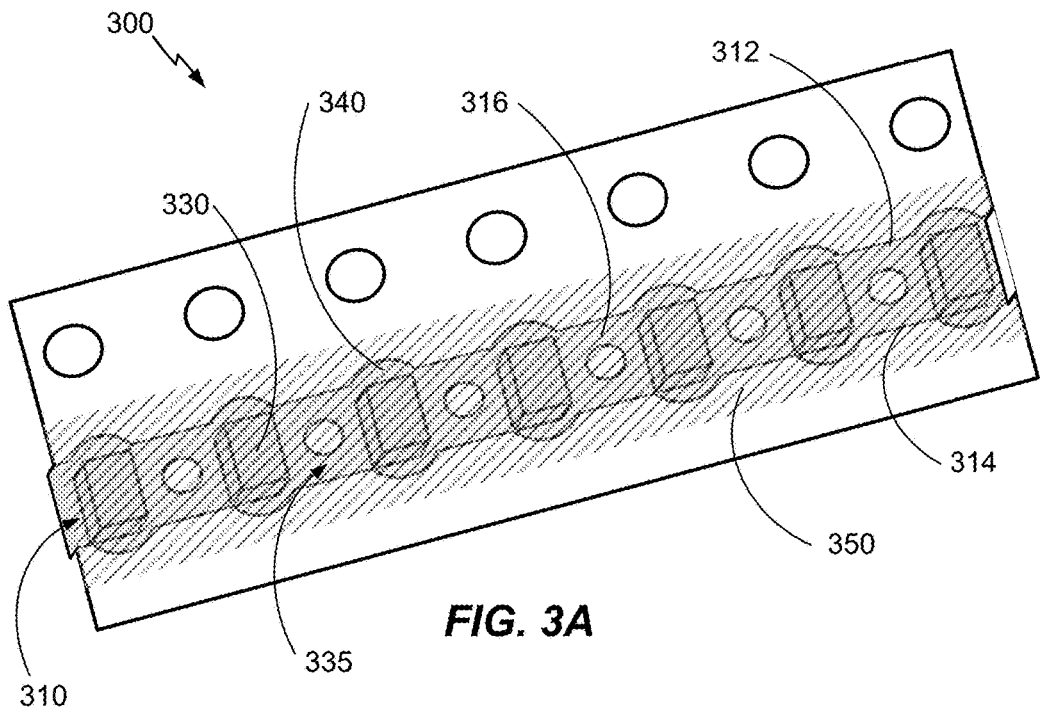
FIGS. 3A and 3B respectively illustrate a perspective view and a top view of an embodiment of a carrier tape.
Figure 3B:
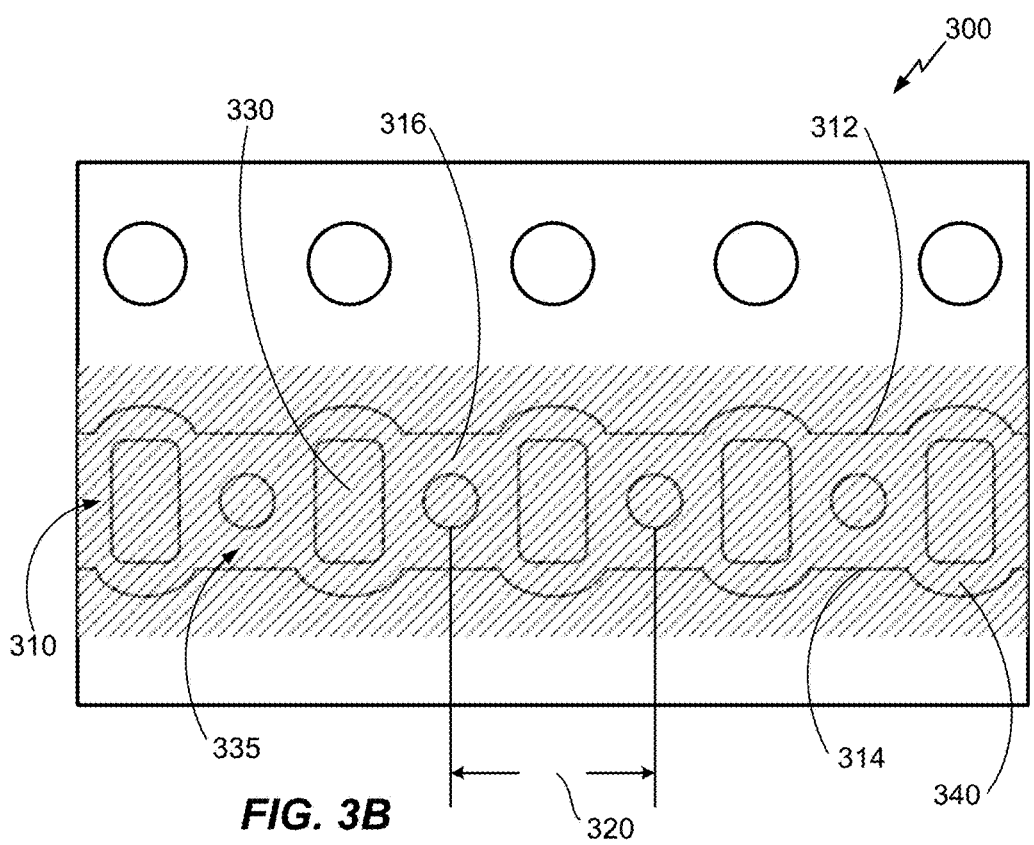

In an aspect, a carrier tape with a continuous channel is proposed. The proposed carrier tape may be used to transport IC devices and dies such as wafer level packages (WLP), bare dies (BD), ball grid arrays (BGA), etc. FIG. 3A illustrates a perspective view and FIG. 3B illustrates a top view of an exemplary embodiment of a proposed carrier tape 300. The carrier tape 300 may include a continuous channel 310 formed along a length of the carrier tape 300. The continuous channel 310 may have a first side wall 312, and second side wall 314 and a floor 316. The continuous channel 310 is very different from the individually embossed pockets 110 of FIGS. 1A and 1B.

In an aspect, the carrier tape 300 may include a plurality of dividers 330, which may be formed in the continuous channel 310. The dividers 330 may be examples of means for dividing the continuous channel 310. The spaces in between each adjacent dividers 330 may effectively create "pockets" or device areas 335 into which the devices 205 may be placed. The dividers 330 may be spaced regularly apart for the desired standardized pitch (e.g., 4 mm, 8 mm, 12 mm, etc.). While not shown, it is contemplated that different portions of a single carrier tape 300 can have different pitches 320 by spacing the dividers 330 differently in the different portions (e.g., a first portion with 4 mm pitches, a second portion with 8 mm pitches, etc.). It is also contemplated that the spacings of the dividers 330 can be varied or customized, e.g., for non-standard requirements.

In an aspect, a plurality of cutouts 340 may be formed in the continuous channel 310. The cutouts 340 may be examples of means for providing corner relief to devices 205. In these figures, the cutouts 340 are in shaped as scallops. But it should be noted that any type of cut back/relief shapes are possible. For example, the cutouts 340 may be trapezoidal. The cutouts 340 may be formed on the first side wall 312 and/or on the second side wall 314 of the continuous channel 310. If the dividers 330 are present, the cutouts 340 may be formed in locations corresponding to the dividers 330. For example, the dividers 330 may be formed on the first and/or the second side wall 312, 314 above and/or below the dividers 330. Similar to the mouse ears 140 of the conventional carrier tape 100, the cutouts 340 may provide corner relief to protect the devices 205 from being damaged. But unlike the mouse ears 140, there are no small features with the cutouts 340. With the elimination of small features, the tooling and forming the carrier tape 300 can be made easier.

In an aspect, the carrier tape 300 may include a cover tape 350 (see FIG. 3A) to hold the devices 205 within the continuous channel 310. The cover tape 350 may be sealed to the top surfaces of the carrier tape 300. While not shown in FIGS. 3A and 3B, a plurality of recesses may be formed on the on the floor 316 of the continuous channel 310 corresponding to the device areas 335. The plurality of recesses may be formed such that when the devices 205 are placed into the device areas 335, the devices 205 may be substantially centered along a width of the continuous channel 310.

Recall that with the conventional cover tape 250 (see FIGS. 2A-2D), it is a challenge to: (1) keep the thin devices from escaping the carrier tape pocket; and (2) prevent chip outs on the active surface of the device from impacts with the carrier tape pocket wall during vibration or drop shock events. However, FIGS. 4A and 4B illustrate an aspect of utilizing a cover tape that satisfactorily addresses one or both issues associated with the conventional cover tape.

Figure 4A:
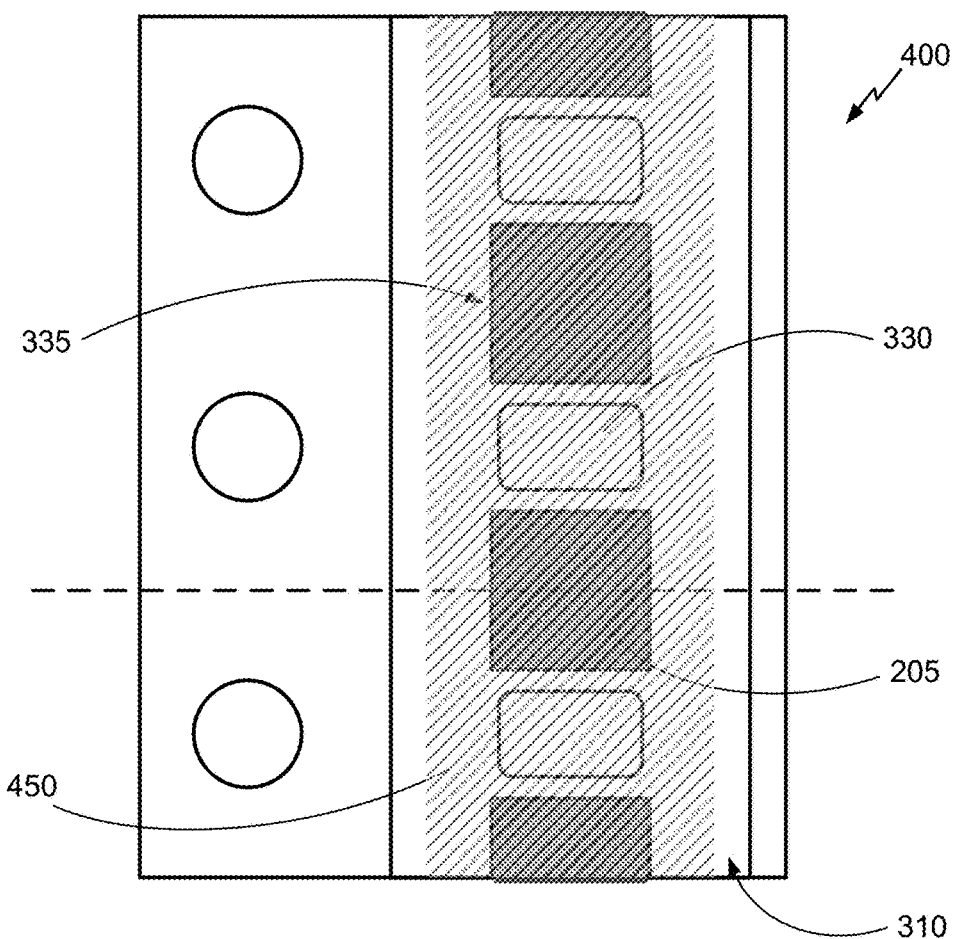
FIGS. 4A and 4B respectively illustrate a top view and a cross sectional view of an embodiment of a carrier tape with a cover tape.
Figure 4B:
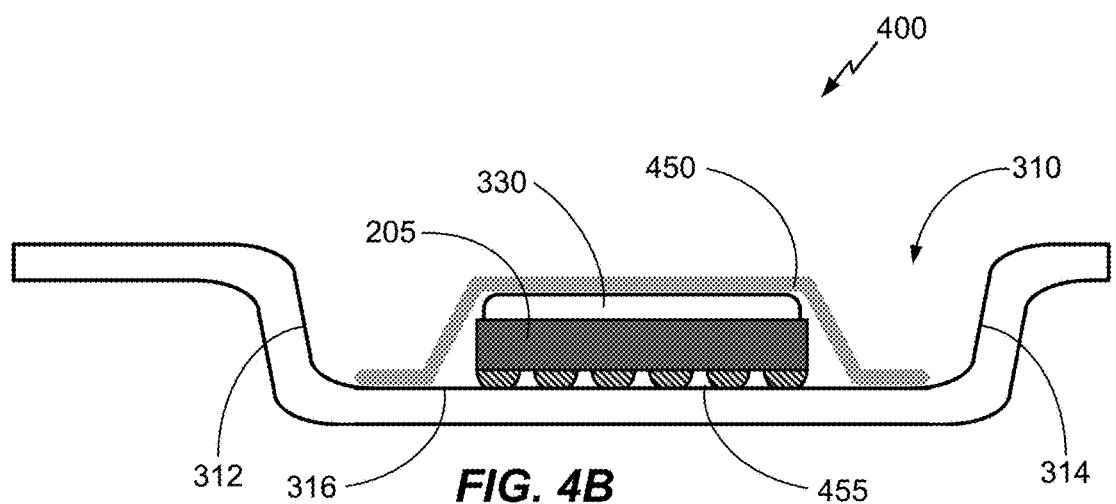

FIG. 4A is a top view of an exemplary carrier tape 400, and FIG. 4B is a cross-sectional view taken along the dashed line of FIG. 4A. Not all element numbers of previous figures are repeated so as to minimize clutter. As seen, the carrier tape 400 may include a continuous channel 310 formed along the length of the carrier tape 400. The continuous channel 310 may have first and second side walls 312, 314 and a floor 316.

The carrier tape 400 of FIGS. 4A and 4B may also include a cover tape 450 configured to hold the devices within the continuous channel 310. The cover tape 450 may be an example of means for covering devices 205. The cover tape 450 may be continuous along the length of the continuous channel 310. As seen in FIG. 4B, the cover tape 450 may cover the top surface of the device 205 and sealed to the floor 316 of the continuous channel 310. This solves at least the following problems. First, the puff up gap between the cover tape and the carrier tape can be eliminated (compare with FIG. 2C). This is because the cover tape 450 may now sit on or above the top surface of the device 205 and be sealed below the top surface of the device 205. This effectively creates a gapless boundary that prevents the device 205 from escaping.

Second, the device 205 can be held away from the side walls 312, 314 of the continuous channel 310. In this way, the device 205 can be isolated from axial shocks (compare with FIG. 2D). The fragile active surface of the device 205 can be completely isolated from these axial shocks as only the top surface (backside) of the device 205 will contact the cover tape 450. Any axial movement of the device 205 will be absorbed by the pliable cover tape 450.

The carrier tape 400 may also include a plurality of dividers 330 formed in the continuous channel 310. Again, the dividers 330 may be examples of means for dividing the continuous channel. Note that in FIGS. 4A and 4B, the dividers 330 are optional. When provided, the top surfaces of the dividers 330 may also be covered by the cover tape 450. The dividers 330 of FIGS. 4A and 4B may be similar to the dividers 330 of FIGS. 3A and 3B. For example, the spaces in between each adjacent dividers 330 may create device areas 335 into which the devices 205 may be placed.

When the dividers 330 are present, they may be formed to be higher than the top surfaces of the devices 205 as seen in FIG. 4B. In this instance, there may be a gap between the top surfaces of the devices 205 and the cover tape 450. That is, contact between the devices 205 and the cover tape 450 can be minimized. This can be advantageous if there is a tendency for the cover tape 450 to stick to the device 205 when they come into contact with each other.

However, it is also possible for the top surfaces of the devices 205 to be at or above the top surfaces of the dividers 330 (not shown). In this instance, the cover tape 450 may contact the top surfaces of the devices 205, i.e., there may be little to no gap between the top surfaces of the devices 205 and the cover tape 450. Similar situation may occur when no dividers 330 are provided. This can be advantageous in that the movements of the devices 205 can be minimized, e.g., during transport.

Also optionally, the carrier tape 400 may include a plurality of recesses 455 formed on the floor 316 of the continuous channel 310 to accommodate the devices 205. The recesses 455 may be examples of means for defining the device areas 235. The recesses 455 may also be examples of means for centering the devices 205. The recesses 455 may correspond to the device areas 335. For example, if the dividers 330 are present, the recesses 455 may be formed in between the adjacent dividers 330. If the dividers 330 are not present, the recesses 455 themselves may define the device areas 335.

Preferably, the recesses 455 are shallow. The recesses 455 may be incorporated along the length of the continuous channel 310. Also, the recesses 455 may be formed to center the devices 205 along the width of the continuous channel 310. As seen in FIG. 4B, the ball grid of the device 205 can sit in the recess 455. The recess 455 promotes centering of the device 205 and during taping and de-taping of the cover tape 450, and also helps to prevent the movement of the device 205 during transport.

Figure 5A:
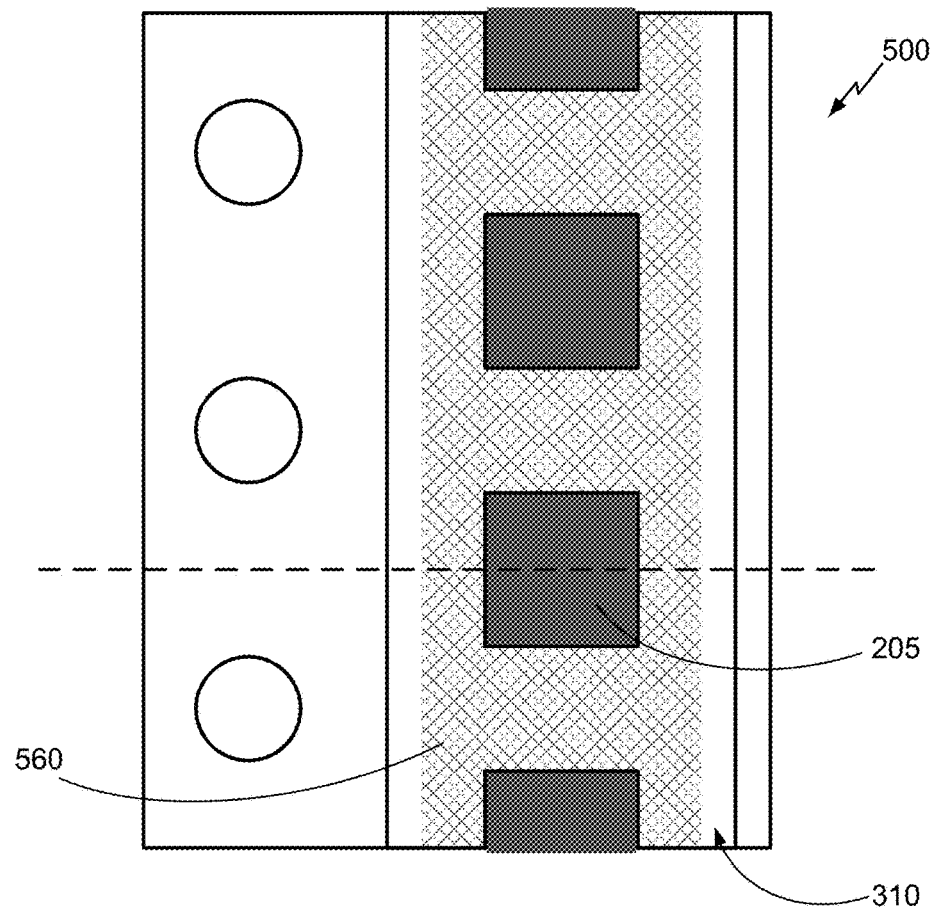
FIGS. 5A and 5B respectively illustrate a top view and a cross sectional view of an embodiment of a carrier tape without defined pitches.
Figure 5B:
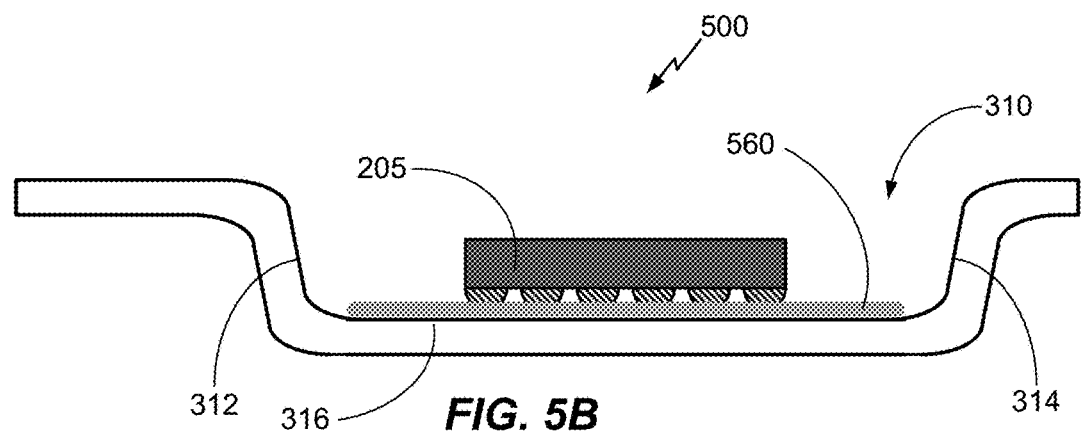

In an aspect, the carrier tape 500 may be configured to be adaptable as illustrated in FIGS. 5A and 5B. FIG. 5A is a top view and FIG. 5B is a cross-sectional view of the carrier tape 500 taken along the dashed line of FIG. 5A. Not all element numbers of previous figures are repeated so as to minimize clutter. Similar to the carrier tape 300 of FIGS. 3A-4B, the carrier tape 500 of FIGS. 5A and 5B may include the continuous channel 310. But unlike the carrier tape 300, the dividers 330 need not be included. By eliminating the individual embossed pockets, there are no structures such as the dividers 330 to establish pockets or pitch.

Instead, the carrier tape 300 may include an adhesive 560 lined to the floor 316 of the continuous channel 310. The adhesive 560 may run the length of the continuous channel 310. The adhesive 560 can be a dual sided pressure sensitive adhesive tape or a dispensed adhesive material. The devices 205 can be loaded into the carrier tape 500, e.g., by pressing them into the floor 316 with sufficient force to activate the adhesive 560. Adhering the devices 205 to the floor 316 can isolate the devices 205 from impacts with the side walls 312, 314 of the continuous channel 310 during transportation and handling. Also, the variation in the device location can be reduced, which in turn can reduce surface mount technology (SMT) pick-and-place (P&P) pick up errors.

The width of the continuous channel 310 can be maximized based on the width of the carrier tape 500. For example, the width of the carrier tape 500 can be finite and standardized (e.g., 8 mm, 12 mm, 16 mm, 24 mm, etc.). Any device 205 whose major axis can fit within the width of the continuous channel 310 can use the carrier tape 500. Each device 205 can be loaded at a minimum standard pitch based on the size of its minor axis. If tape nesting is a concern, protrusions and/or ribs can be added to a back side of the carrier tape 500 (not shown) to prevent one tape layer from setting into the one below it as these are wound on a reel of the carrier tape 500.

Note that with the carrier tape 500, the need for customized pocket dimensions is eliminated, and any device 205 that can fit within a given width can use a common tape. In other words, no defined pocket size or pitch enables the reuse of a single tape design across many different products. This can significantly reduce the number of different carrier tape tools needed, which drives economies of scale, and thus reduces cost. This can also reduce lead time for tooling development and fabrication as custom tape tooling is not needed and new packages can use the off the shelf tape. The continuous channel 310 enables uninterrupted application of adhesive 560 (tape or dispense), which scales very well for high volume manufacturing (HVM). Another advantage is that airborne debris will stick to the adhesive 560 and not to the devices 205 due to the flypaper effect.

With the carrier tape 500, the cover tape 450 is no longer necessary. This can result in further cost savings and improve in-tape inspection. While the cover tape 450 is not required, it may still be provided (not shown in FIGS. 5A and 5B). In other words, the cover tape 450 is optional. When it is provided, the cover tape 450 may sit on or above the top surface of the device 205 and sealed below the top surface of the device 205. For example, the cover tape 450 may be sealed to the floor 316 of the continuous channel 310 or to the adhesive 560 below the top surface of the device 205.

Figure 6:
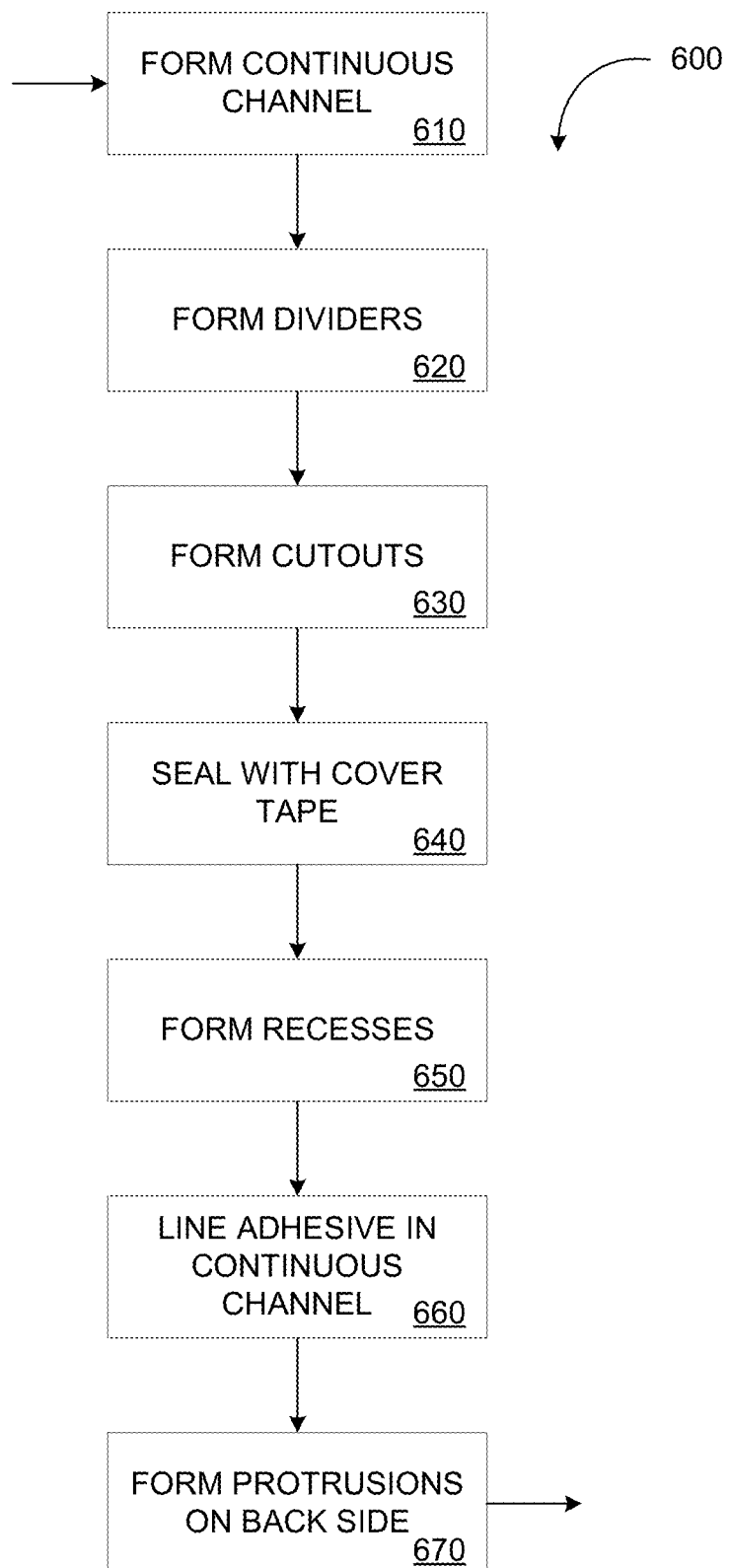
FIG. 6 illustrates a flow chart of an example method to manufacture a carrier tape.

FIG. 6 illustrates a flow chart of an example method 600 to manufacture a carrier tape 300, 400, 500. It should be noted that not all blocks of the method 600 need be performed. Also, the blocks of the method 600 need not be performed in any particular order. In block 610, a continuous channel 310 may be formed along a length of the carrier tape.

In block 620, a plurality of dividers 330 may be formed in the continuous channel 310 such that the dividers 330 extend from the floor 316 of the continuous channel 310. Alternatively or in addition thereto, the dividers 330 may be formed such that the spaces between each pair of adjacent dividers 330 correspond to the device areas 335) into which the devices 205 are placed.

In block 630, a plurality of cutouts 340 may be formed in the continuous channel 310 to provide corner relief to the devices 205 placed in the device areas 335. The cutouts 340 may be formed along the first side wall 312 and/or the second side wall 314. If the dividers 330 are formed, the cutouts 340 may be formed in locations corresponding to the dividers 330 such as above and/or below the dividers 330.

In block 640, a cover tape 350, 450 may be placed such that the devices 205 are held within the continuous channel 310. For example, as illustrated in FIG. 3A, the cover tape 350 may be sealed to the top surfaces of the carrier tape 300. Alternatively, as illustrated in FIGS. 4A and 4B, the cover tape 450 may be placed to sit on or above a top surface of the device 205 and sealed below the top surface of the device 205 to the floor 316 of the continuous channel 310. The cover tape 450 may also be sealed continuous along the length of the continuous channel 310.

In block 650, a plurality of recesses 455 may be formed in the continuous channel 310 corresponding to the device areas 335. The recesses 455 may be formed such that the devices 205 are centered along a width of the continuous channel 310 when they are placed in the device areas 335.

In block 660, the floor 316 of the continuous channel 310 may be lined with an adhesive 560. The adhesive 560 may act to hold the devices 205 in place within the continuous channel. When the cover tape 450 is provided, the cover tape 450 may be sealed to the adhesive 560 on both sides of the device 205.

In block 670, protrusions may be formed on the back side of the carrier tape.

Note that some of the blocks may be performed simultaneously or at least contemporaneously. For example, the carrier tape 300, 400, 500 may be manufactured in an embossing processing which may include heating a flat tape and embossing by carrier tape tooling. One or more features (continuous channel 310, dividers 330, cutouts 340, recesses 455, ribs/protrusions, etc.) may be formed together during the tooling process. That is, one or more of the blocks 610, 620, 630, 650 and 670 may be performed simultaneously.

Also, in an aspect, performing block 640 may comprise utilizing a separately manufactured cover tape 350, 450 in a variety of ways. As an illustration, the cover tape 350, 450 made of a flexible film may be draped over the dividers 330 and sealed to the floor 316 of the continuous channel 310. With the embodiments illustrated in FIGS. 3A and 3B, after the carrier tape 300 is formed, the devices 205 may be placed into the device areas 335 between the dividers 330. For example, the devices 205 may be dropped into the device areas 335 from a short height (e.g., 0.5 mm). Then the cover tape 350 may be sealed to the top surface of the carrier tape 300 along the length of the carrier tape 300. This may be summarized as: form carrier tape→place devices in device areas→seal cover tape on top of carrier tape.

With the embodiments illustrated in FIGS. 4A and 4B, after the carrier tape 400 is formed, the devices 205 may be placed into the device areas 335 between the dividers 330. For example, the devices 205 may be dropped into the device areas 335 from a height small enough to prevent the devices 205 from bouncing out of the device areas 335. Then the cover tape 450 may be sealed to the floor 316 of the continuous channel 310 in parallel seal lines along the length of the carrier tape 300 on both sides of the devices 205. The distance between the seal lines may be determined by the size of the devices 205 and a desired angle incidence between the device 205 and the cover tape 450. This may be summarized as: form carrier tape→place devices in device areas→seal cover tape to floor of continuous channel.

With the embodiments illustrated in FIGS. 5A and 5B, after the carrier tape 500 is formed, the adhesive 560 may be lined in the continuous channel 310, i.e., block 660 may be performed. In an aspect, this may be completed in-line and after the carrier tape forming (e.g., embossing) and may entail a continuous application of a dual sided adhesive tape or a process to continuously dispense adhesive into the continuous channel 310. Optionally, a post dispense curing step may be performed. The devices 205 may then be placed along a centerline of the continuous channel 310 at a desired pitch. The devices 205 may be pushed into the adhesive 560 with sufficient pressure to activate the adhesive 560. The cover tape 450, which is optional, may be added (sealed on the top surface of the carrier tape 310 or onto the floor of the continuous channel 310). This may be summarized as: form carrier tape→apply adhesive to continuous channel→place devices onto adhesive→add cover tape (optional).

A non-exhaustive list of benefits of one or more aspects the proposed carrier tape is as follows:

Eliminates the small bridge problem.
Permits true pitch minimization without sacrificing device corner protection, e.g., by providing cutouts.
Simplifies carrier tape tooling, e.g., by eliminating the small features required to form traditional corner relief.
Enables highly-efficient rotary tool forming
Eliminates the risk of device migration, e.g., by sealing the cover tape in the continuous channel below the top surface of the carrier tape to eliminate the gap between the cover tape and carrier tape.
Isolates the device from impacts with the side walls of the continuous channel, and protects the device by the pliable cover tape absorbing impact energy.
Isolates the edges of the active (fragile) surface of the device from axial impacts.
Prevents impacts to devices during transportation.
Reduces the variation in device location.
Eliminates the need for customized pocket dimensions.
Reduces development lead time for tooling development and fabrication.
Enables uninterrupted application of adhesive.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the present disclosure can include a computer readable media embodying a method for manufacturing a carrier tape. Accordingly, the present disclosure is not limited to illustrated examples and any means for performing the functionality described herein are included in embodiments of the present disclosure.

While the foregoing disclosure shows illustrative embodiments of the present disclosure, it should be noted that various changes and modifications could be made herein without departing from the scope of the present disclosure as defined by the appended claims. The functions, steps and/or actions of the method claims in accordance with the embodiments of the present disclosure described herein need not be performed in any particular order. Furthermore, although elements of the present disclosure may be described or claimed in the singular, the plural is contemplated unless limitation to the singular is explicitly stated.

What is claimed is:

1. A carrier tape, comprising:
a continuous channel formed along a length of the carrier tape, the continuous channel having first and second side walls and a floor; and
a cover tape configured to hold devices on the floor within the continuous channel,
wherein the cover tape covers top surfaces of the devices and is sealed to the floor of the continuous channel on both sides of the devices.

2. The carrier tape of claim 1, wherein the cover tape is continuous along a length of the continuous channel.

3. The carrier tape of claim 1, further comprising:
a plurality of dividers formed in the continuous channel, the plurality of dividers extending from the floor of the continuous channel,
wherein spaces between each pair of adjacent dividers correspond to device areas into which the devices are placed.

4. The carrier tape of claim 3, wherein the plurality of dividers are higher than the top surfaces of the devices such that there is a gap between the top surfaces of the devices and the cover tape.

5. The carrier tape of claim 3, wherein there is no gap between the top surfaces of the devices and the cover tape.

6. The carrier tape of claim 3, wherein a width of each of the plurality of dividers is less than a width of the continuous channel.

7. The carrier tape of claim 1, further comprising:
a plurality of recesses formed on the floor of the continuous channel,
wherein the plurality of recesses correspond to device areas into which the devices are placed.

8. The carrier tape of claim 7, wherein the plurality of recesses are configured to center the devices along a width of the continuous channel.

9. The carrier tape of claim 1, further comprising:
an adhesive lined to the floor of the continuous channel,
wherein the adhesive is configured to hold the devices in place within the continuous channel.

10. The carrier tape of claim 9, wherein the cover tape is sealed to the adhesive on both sides of the devices.

11. The carrier tape of claim 1, wherein the cover tape is sealed to the floor such that the seals on both sides of the devices between the cover tape and the floor are continuous along the length of the continuous channel.

12. The carrier tape of claim 1, wherein the first and second sidewalls are not in an area sealed by the cover tape.

13. The carrier tape of claim 1, wherein the first and second sidewalls are not in an area sealed by the means for covering.

14. A method, comprising:
forming a continuous channel along a length of a carrier tape such that the continuous channel has first and second side walls and a floor; and
placing a cover tape such that devices are held on the floor within the continuous channel,
wherein placing the cover tape comprises:
covering top surfaces of the devices with the cover tape; and
sealing the cover tape to the floor of the continuous channel on both sides of the devices.

15. The method of claim 14, wherein placing the cover tape further comprises placing the cover tape continuously along a length of the continuous channel.

16. The method of claim 14, further comprising forming a plurality of dividers in the continuous channel such that
the plurality of dividers extend from the floor of the continuous channel, and
spaces between each pair of adjacent dividers correspond to device areas into which the devices are placed.

17. The method of claim 16, wherein forming the plurality of dividers comprises forming the plurality of dividers to be higher than the top surfaces of the devices such that there is a gap between the top surfaces of the devices and the cover tape.

18. The method of claim 16, wherein placing the cover tape such that there is no gap between the top surfaces of the devices and the cover tape.

19. The method of claim 16, wherein a width of each of the plurality of dividers is less than a width of the continuous channel.

20. The method of claim 14, further comprising forming a plurality of recesses on the floor of the continuous channel corresponding to device areas into which the devices are placed.

21. The carrier tape of claim 20, wherein forming comprises forming the plurality of recesses so as to center the devices along a width of the continuous channel.

22. The method of claim 14, further comprising lining an adhesive to the floor of the continuous channel such that the devices are held in place within the continuous channel by the adhesive.

23. The method of claim 22, wherein placing the cover tape further comprises sealing the cover tape to the adhesive on both sides of the devices.

24. The method of claim 14, wherein the cover tape is sealed to the floor such that the seals on both sides of the devices between the cover tape and the floor are continuous along the length of the continuous channel.

25. The method of claim 14, wherein the first and second sidewalls are not in an area sealed by the cover tape.

26. A carrier tape, comprising:
a continuous channel formed along a length of the carrier tape, the continuous channel having first and second side walls and a floor; and
means for covering devices on the floor within the continuous channel,
wherein the means for covering covers top surfaces of the devices and is sealed to the floor of the continuous channel on both sides of the devices.

27. The carrier tape of claim 26, wherein the means for covering is continuous along a length of the continuous channel.

28. The carrier tape of claim 26, further comprising:
a plurality of means for dividing formed in the continuous channel, the plurality of means for dividing extending from the floor of the continuous channel,
wherein spaces between each pair of adjacent means for dividing correspond to device areas into which the devices are placed.

29. The carrier tape of claim 28, wherein a width of each of the plurality of means for dividing is less than a width of the continuous channel.

30. The carrier tape of claim 26, wherein the means for covering is sealed to the floor such that the seals on both sides of the devices between the means for covering and the floor are continuous along the length of the continuous channel.

* * * * *